United States Patent
Xiang et al.

(10) Patent No.: US 6,274,420 B1
(45) Date of Patent: Aug. 14, 2001

(54) STI (SHALLOW TRENCH ISOLATION) STRUCTURES FOR MINIMIZING LEAKAGE CURRENT THROUGH DRAIN AND SOURCE SILICIDES

(75) Inventors: Qi Xiang, San Jose; Wei Long, Sunnyvale; Ming-Ren Lin, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/510,786

(22) Filed: Feb. 23, 2000

(51) Int. Cl.[7] .............................................. H01L 21/8238
(52) U.S. Cl. .......................................... 438/221; 438/359
(58) Field of Search ..................................... 438/221, 218, 438/259, 270, 305, 306, 359, 424, 583, 651, 682, 700, 755, 721

(56) References Cited

U.S. PATENT DOCUMENTS

| | | | |
|---|---|---|---|
| 6,087,706 | * | 7/2000 | Dawson et al. ................. 257/520 |
| 6,121,100 | * | 9/2000 | Andideh et al. ................. 438/305 |
| 6,165,826 | * | 12/2000 | Chay et al. ..................... 438/231 |

* cited by examiner

Primary Examiner—David Nelms
Assistant Examiner—David Nhu
(74) Attorney, Agent, or Firm—Monica H. Choi

(57) ABSTRACT

STI (Shallow Trench Isolation) structures are fabricated such that leakage current is minimized through a field effect transistor fabricated between the STI structures. The shallow trench isolation structure include a pair of isolation trenches, with each isolation trench being etched through a semiconductor substrate. A first dielectric material fills the pair of isolation trenches and extends from the isolation trenches such that sidewalls of the first dielectric material filling the isolation trenches are exposed beyond the top of the semiconductor substrate. A second dielectric material is deposited on the sidewalls of the first dielectric material exposed beyond the top of the semiconductor substrate. The second dielectric material has a different etch rate in an acidic solution from the first dielectric material filling the isolation trenches. The present invention may be used to particular advantage when the first dielectric material filling up the isolation trenches is comprised of silicon dioxide, and when the second dielectric material deposited on the sidewalls of the first dielectric material is comprised of silicon nitride. With the protective silicon nitride covering the sidewalls of the silicon dioxide filling the STI (shallow trench isolation) trenches, formation of divots is avoided in the silicon dioxide filling the STI (shallow trench isolation) trenches. Thus, when a field effect transistor is fabricated between such STI structures, silicides formed near the STI structures do not extend down toward the junction of the drain contact region and the source contact region of the field effect transistor such that drain and source leakage current is minimized.

7 Claims, 4 Drawing Sheets

STI (SHALLOW TRENCH ISOLATION) STRUCTURES FOR MINIMIZING LEAKAGE CURRENT THROUGH DRAIN AND SOURCE SILICIDES

BACKGROUND OF THE INVENTION

1. Field of the Invention

The present invention relates generally to fabrication of field effect transistors having scaled-down dimensions, and more particularly, to a method for fabricating improved STI (Shallow Trench Isolation) structures for minimizing leakage current through drain and source silicides of a field effect transistor.

2. Description of the Related Art

A long-recognized important objective in the constant advancement of monolithic IC (integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC includes STI (Shallow Trench Isolation) structures that are formed within a semiconductor substrate 102. STI (Shallow Trench Isolation) structures include a first STI (Shallow Trench Isolation) trench 104 and a second STI (Shallow Trench Isolation) trench 106 formed within the semiconductor substrate 102. The first STI (Shallow Trench Isolation) trench 104 is filled with a first liner oxide 108 and a first STI (Shallow Trench Isolation) filler 110. Similarly, the second STI (Shallow Trench Isolation) trench 106 is filled with a second liner oxide 112 and a second STI (Shallow Trench Isolation) filler 114. The first STI filler 110 and the second STI filler 114 may be comprised of silicon dioxide for example.

Referring to FIG. 2, a MOSFET 200 is fabricated within an active device area between the two STI (Shallow Trench Isolation) trenches 104 and 106. The MOSFET 200 includes a drain extension 202 and a drain contact region 204 and includes a source extension 206 and a source contact region 208. The MOSFET 200 further includes a gate dielectric 210 and a gate structure 212 disposed over the gate dielectric 210. A spacer structure 214 is disposed on the sidewalls of the gate structure 212.

During fabrication of the MOSFET 200, acidic solutions, such as a solution of HF (hydrogen fluoride) is used for etching the various structures of the MOSFET 200. When the first STI filler 110 and the second STI filler 114 are comprised of silicon dioxide, such acidic solutions may etch away the first STI filler 110 and the second STI filler 114 resulting in a first divot 216 at the side of the first STI filler 110 facing the MOSFET 200 and in a second divot 218 at the side of the second STI filler 114 facing the MOSFET 200.

Silicide is formed for making contact with the drain, the source, and the gate of the MOSFET 200. A drain silicide 302 is formed in the drain contact region 204, a source silicide 304 is formed in the source contact region 208, and a gate silicide 306 is formed in the gate structure 212. Because the first divot 216 exposes the drain contact region 204 down toward the junction of the drain contact region 204, the drain silicide 302 extends down toward the junction of the drain contact region 204 near the first divot 216. Similarly, because the second divot 218 exposes the source contact region 208 down toward the junction of the source contact region 208, the source silicide 304 extends down toward the junction of the source contact region 208 near the second divot 218. The proximity of the drain silicide 302 to the junction of the drain contact region 204 results in undesired drain leakage current, and the proximity of the source silicide 304 to the junction of the source contact region 208 results in undesired source leakage current.

Thus, STI (Shallow Trench Isolation) structures that do not contribute to generation of such undesired leakage current through the drain and source of the MOSFET is desired.

SUMMARY OF THE INVENTION

Accordingly, in a general aspect of the present invention, STI (Shallow Trench Isolation) structures are fabricated such that leakage current is minimized through a field effect transistor fabricated between the STI structures.

In one embodiment of the present invention, for forming shallow trench isolation structures, each of a pair of isolation trenches is etched through a layer of first dielectric material and a semiconductor substrate. The layer of first dielectric material is deposited on the semiconductor substrate. The pair of isolation trenches is filled with a second dielectric material with the second dielectric material extending up to fill the isolation trenches through the first dielectric material. The layer of first dielectric material is etched away such that sidewalls of the second dielectric material filling the isolation trenches are exposed beyond the top of the semiconductor substrate. A third dielectric material is conformally deposited on exposed surfaces of the second dielectric material filling the isolation trenches and on the semiconductor substrate. The third dielectric material is anisotropically etched such that the third dielectric material remains at the sidewalls of the second dielectric material exposed beyond the top of the semiconductor substrate. The third dielectric material has a different etch rate in an acidic solution from the second dielectric material filling the isolation trenches.

The present invention may be used to particular advantage when the layer of first dielectric material is comprised of silicon nitride on the semiconductor substrate comprised of silicon, and when the second dielectric material filling up the isolation trenches is comprised of silicon dioxide, and when the third dielectric material deposited on the sidewalls of the second dielectric material is comprised of silicon nitride.

In this manner, with the protective silicon nitride covering the sidewalls of the silicon dioxide filling the STI (shallow trench isolation) trenches, formation of divots is avoided in the silicon dioxide filling the STI (shallow trench isolation) trenches. Thus, when a field effect transistor is fabricated between such STI structures, silicides formed near the STI structures do not extend down toward the junction of the drain contact region and the source contact region of the field effect transistor such that drain and source leakage current is minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 4:
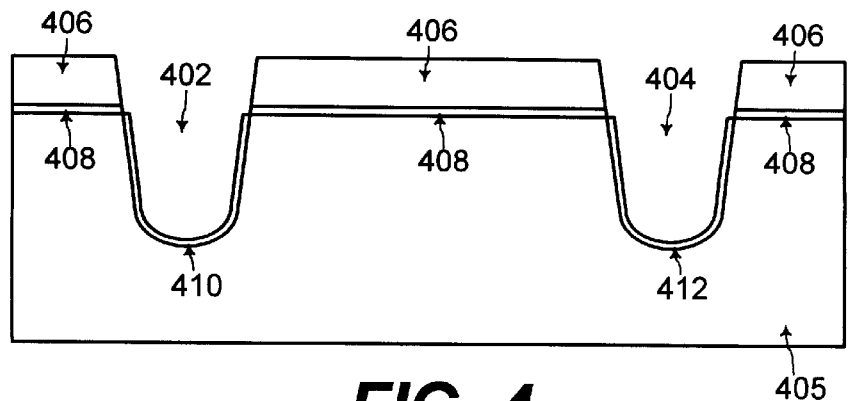
FIGS. 4, 5, 6, 7, 8, 9, 10, 11, and 12 show cross-sectional views of STI (shallow trench isolation) structures formed with prevention of formation of divots on the sidewalls of the STI structures for preventing leakage current through a MOSFET formed between the STI structures, according to an embodiment of the present invention.

Referring to FIG. 4, for formation of STI (shallow trench isolation) structures of an embodiment of the present invention, a first STI (shallow trench isolation) trench 402 and a second STI (shallow trench isolation) trench 404 are formed in a semiconductor substrate 405. Furthermore, the first STI trench 402 and the second STI trench 404 also extend through a layer of silicon nitride 406 deposited on the semiconductor substrate 405. When the semiconductor substrate 405 is comprised of silicon, a layer of sacrificial oxide 408 is deposited between the semiconductor substrate 405 and the layer of silicon nitride 406. Furthermore, a first liner oxide 410 is deposited at the exposed walls of the first STI trench 402, and a second liner oxide 412 is deposited at the exposed walls of the second STI trench 404. Processes for etching the STI trenches 402 and 404 and for deposition of the layer of silicon nitride 406, of the layer of sacrificial oxide 408, and of the first and second liner oxides 410 and 412 are known to one of ordinary skill in the art of integrated circuit fabrication.

Figure 5:
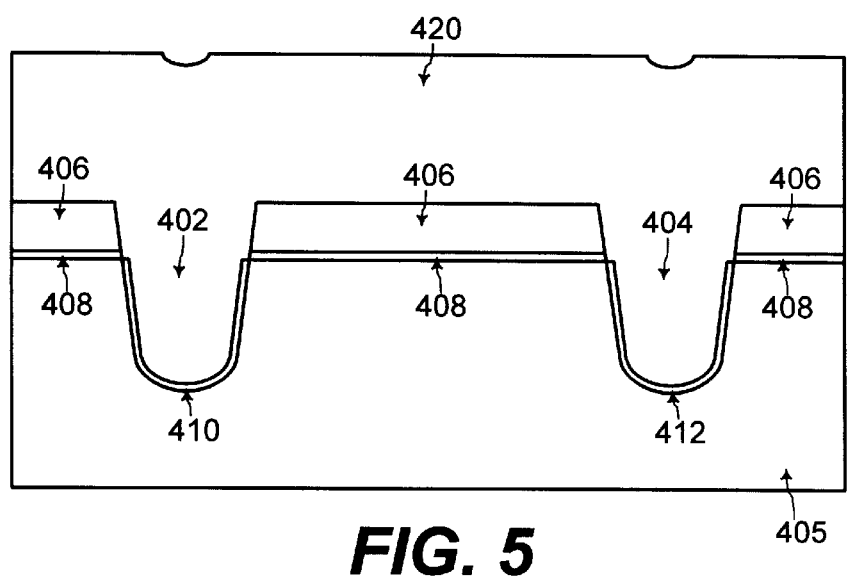

Referring to FIG. 5, silicon dioxide 420 is deposited to fill the first STI trench 402 and the second STI trench 404. Such deposition of the silicon dioxide 420 extends beyond the layer of silicon nitride 406 surrounding the first STI trench 402 and the second STI trench 404. Processes for deposition of such silicon dioxide 420 are known to one of ordinary skill in the art of integrated circuit fabrication.

Figure 6:
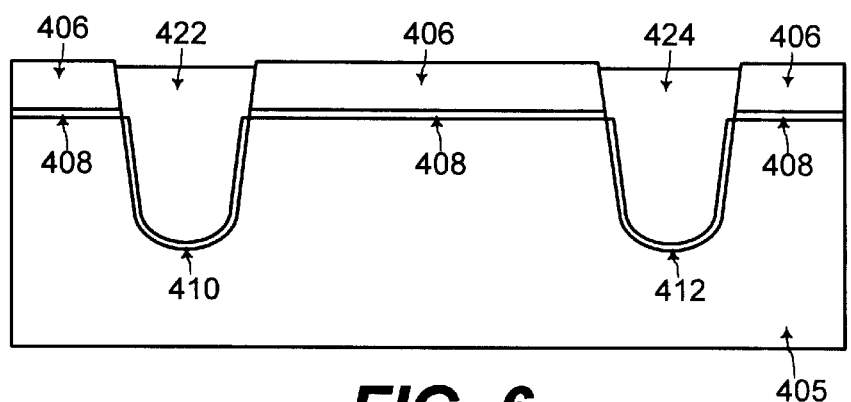

Referring to FIGS. 5 and 6, the silicon dioxide 420 extending beyond the layer of silicon nitride 406 is polished off with the layer of silicon nitride 406 acting as an etch stop layer. Processes, such a CMP (chemical mechanical polishing) processes, for polishing the silicon dioxide 420 are known to one of ordinary skill in the art of integrated circuit fabrication. Referring to FIG. 6, with such polishing of the silicon dioxide 420, the silicon dioxide 420 is contained within the first STI trench 402 to form a first STI filler 422 and within the second STI trench 404 to form a second STI filler 424.

Figure 7:
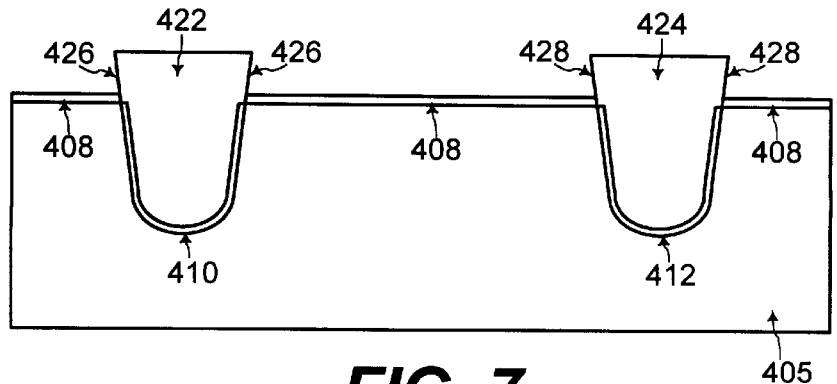

Referring to FIGS. 6 and 7, the layer of silicon nitride 406 is then etched off, and first sidewalls 426 of the first STI filler 422 are exposed for the portion of the first STI filler 422 that extends beyond the semiconductor substrate 405. Similarly, second sidewalls 428 of the second STI filler 424 are exposed for the portion of the second STI filler 424 that extends beyond the semiconductor substrate 405. Processes for selectively etching off the layer of silicon nitride 406 are known to one of ordinary skill in the art of integrated circuit fabrication.

Figure 8:
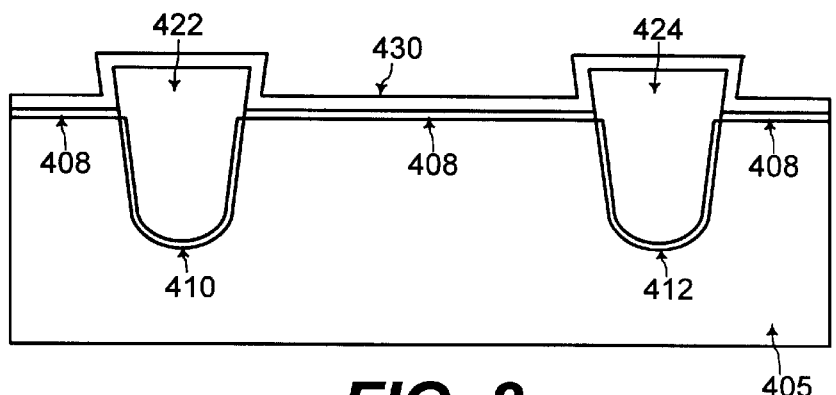

Referring to FIGS. 7 and 8, in accordance with an embodiment of the present invention, a layer of silicon nitride 430 is then conformally deposited to cover the first sidewalls 426 of the first STI filler 422 and the second sidewalls 428 of the second STI filler 424 and other exposed surfaces of the STI fillers 422 and 424 and of the layer of sacrificial oxide 408 on the semiconductor substrate 405. Processes for conformally depositing the layer of silicon nitride 430 are known to one of ordinary skill in the art of integrated circuit fabrication.

Figure 9:
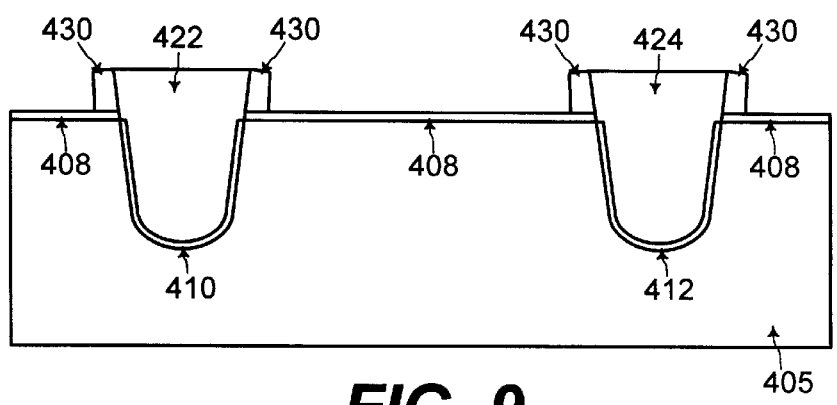

Referring to FIGS. 8 and 9, the layer of silicon nitride 430 that has been conformally deposited is then anisotropically etched such that silicon nitride 430 remains on the first sidewalls 426 of the first STI filler 422 and on the second sidewalls 428 of the second STI filler 424. Processes for anisotropically etching the layer of silicon nitride 430 are known to one of ordinary skill in the art of integrated circuit fabrication.

Figure 10:
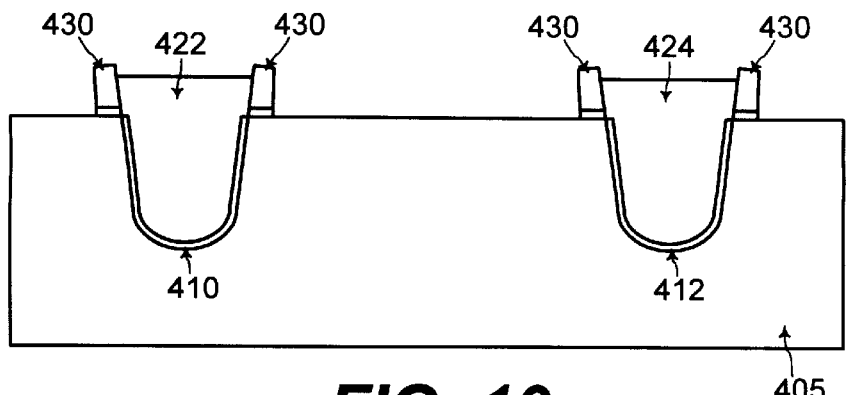
Figure 11:
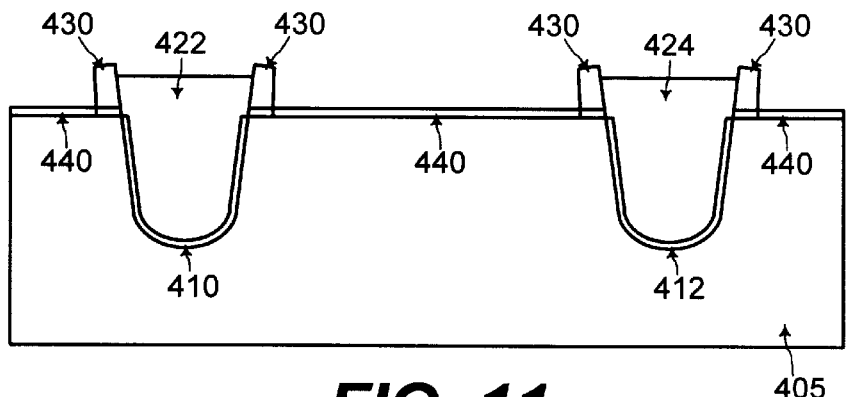

Referring to FIGS. 9 and 10, the layer of sacrificial oxide 408 is etched away, and processes for etching the layer of sacrificial oxide 408 are known to one of ordinary skill in the art of integrated circuit fabrication. Referring to FIGS. 10 and 11, a layer of gate dielectric 440 is deposited on the semiconductor substrate 405 for formation of a MOSFET (Metal Oxide Semiconductor Field Effect Transistor) between the first STI filler 422 and the second STI filler 424.

Figure 12:
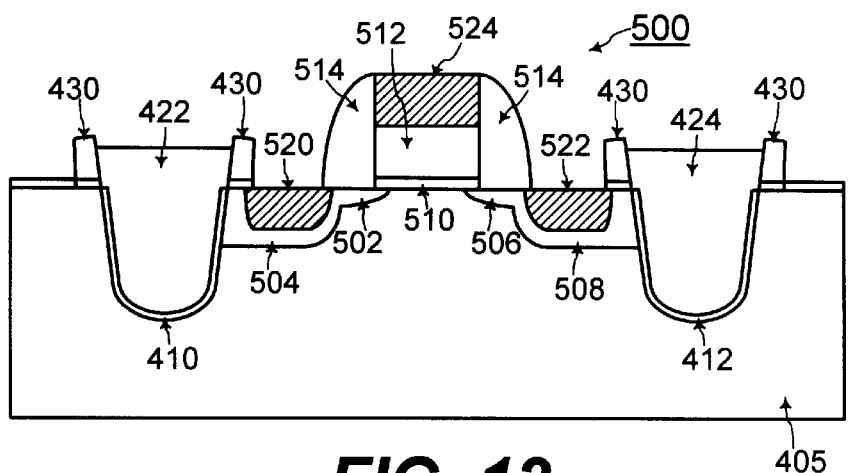

Referring to FIG. 12, a MOSFET 500 is formed within an active device area between the first STI filler 422 and the second STI filler 424. The MOSFET 500 includes a drain extension 502 and a drain contact region 504 and includes a source extension 506 and a source contact region 508. The MOSFET 500 further includes a gate dielectric 510 and a gate structure 512 disposed over the gate dielectric 510. A spacer structure 514 is disposed on the sidewalls of the gate structure 512.

Figure 1:
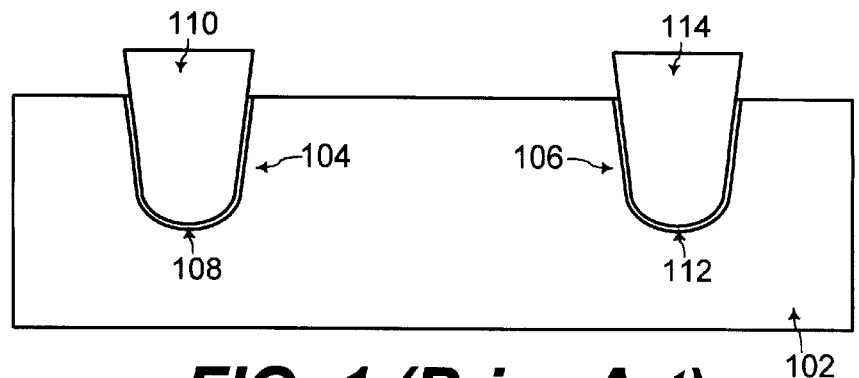
FIG. 1 shows a cross-sectional view of STI (shallow trench isolation) structures, as known in the prior art.
Figure 2:
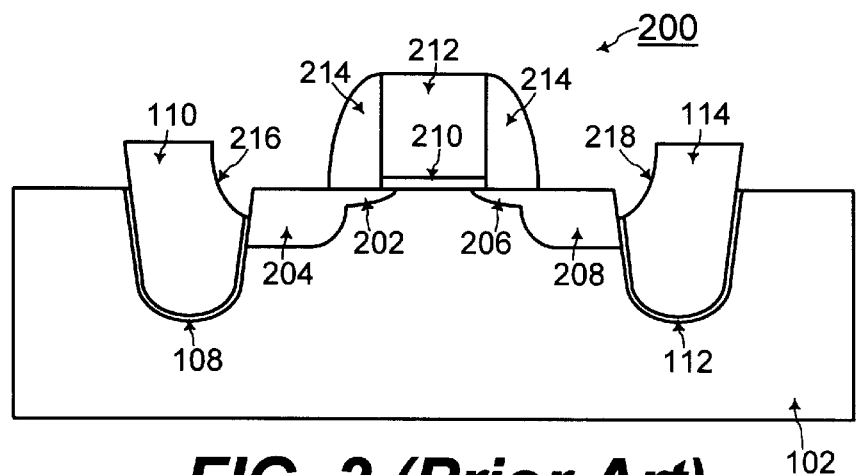
FIG. 2 shows a cross-sectional view of a MOSFET fabricated between the STI structures of FIG. 1 with development of divots in the STI structures, as known in the prior art.
Figure 3:
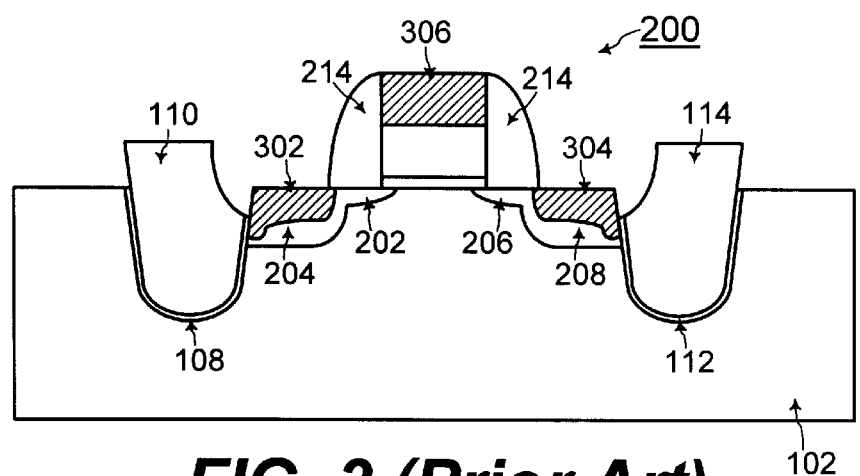
FIG. 3 shows a cross-sectional view of the MOSFET of FIG. 2 with silicide formation in such a MOSFET resulting in undesired drain and source leakage current from the divots of the STI structures of the prior art.

During fabrication of the MOSFET 500, acidic solutions, such as a solution of HF (hydrogen fluoride) is used for etching the various structures of the MOSFET 500. Comparing FIGS. 3 and 12, because the protective silicon nitride 430 covers the sidewalls of the first STI filler 422 and the second STI filler 424, such acidic solutions do not etch away the first STI filler 422 and the second STI filler 424 since the silicon nitride 430 has a different etch rate from silicon dioxide in acidic solutions. Thus, the formation of the divots at the side of the first STI filler 422 and the second STI filler 424 are avoided with the STI (Shallow Trench Isolation) structures of the present invention.

Referring to FIG. 12, a drain silicide 520 is formed in the drain contact region 504, a source silicide 522 is formed in the source contact region 508, and a gate silicide 524 is formed in the gate structure 512. Comparing FIGS. 3 and 12, formation of divots is prevented with the protective silicon nitride 430 at the sidewalls of the first STI filler 422 and the second STI filler 424. Thus, the drain silicide 520 does not extend down toward the junction of the drain contact region 504 near the first STI filler 422. Similarly, the source silicide 522 does not extend down toward the junction of the source contact region 508 near the second STI filler 424. In this manner, because the proximity of the drain silicide 520 to the junction of the drain contact region 504 and of the source silicide 522 to the junction of the source contact region 508 is avoided with the present invention, drain leakage current and source leakage current are minimized with the STI structures of the present invention.

The foregoing is by way of example only and is not intended to be limiting. For example, any specified material of any structure described herein is by way of example only. In addition, the shapes of the STI structures such as the shape of the STI trenches are by way of example only. Furthermore, as will be understood by those skilled in the art, the structures described herein may be made or used in the same way regardless of their position and orientation. Accordingly, it is to be understood that terms and phrases such as "on" and "sidewall" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for forming shallow trench isolation structures, the method including the steps of:
    A. etching a pair of isolation trenches with each isolation trench being etched through a layer of first dielectric material and a semiconductor substrate, said layer of first dielectric material being deposited on said semiconductor substrate;
    B. filling said pair of isolation trenches with a second dielectric material, said second dielectric material extending up to fill said isolation trenches through said first dielectric material;
    C. etching away said layer of first dielectric material after said step B such that sidewalls of said second dielectric material filling said isolation trenches are exposed beyond the top of said semiconductor substrate;
    D. conformally depositing a third dielectric material on exposed surfaces of said second dielectric material filling said isolation trenches and on said semiconductor substrate; and
    E. anisotropically etching said third dielectric material such that said third dielectric material remains at sidewalls of said second dielectric material exposed beyond the top of said semiconductor substrate, said third dielectric material having a different etch rate in an acidic solution from said second dielectric material filling said isolation trenches.

2. The method of claim 1, further including the step of:
    forming a field effect transistor in an active device area between said pair of isolation trenches in said semiconductor substrate, wherein a drain silicide and a source silicide of said field effect transistor abuts said third dielectric material on said sidewalls of said second dielectric material filling said isolation trenches.

3. The method of claim 1, wherein said layer of first dielectric material is comprised of silicon nitride on said semiconductor substrate comprised of silicon.

4. The method of claim 3, wherein said second dielectric material filling up said isolation trenches is comprised of silicon dioxide.

5. The method of claim 4, wherein said third dielectric material deposited on said sidewalls of said second dielectric material is comprised of silicon nitride.

6. The method of claim 5, wherein said step B further includes the step of:
    growing a liner silicon dioxide on sidewalls of said isolation trenches having exposed silicon of said semiconductor substrate.

7. A method for forming shallow trench isolation structures, the method including the steps of:
    A. etching a pair of isolation trenches with each isolation trench being etched through a first layer of silicon nitride and a silicon semiconductor substrate, said first layer of silicon nitride being deposited on said silicon semiconductor substrate;
    B. filling said pair of isolation trenches with silicon dioxide, said silicon dioxide extending up to fill said isolation trenches through said first layer of silicon nitride, said step B further including the step of:
        growing a liner silicon dioxide on sidewalls of said isolation trenches having exposed silicon of said semiconductor substrate;
    C. etching away said first layer of silicon nitride after said step B such that sidewalls of said silicon dioxide filling said isolation trenches are exposed beyond the top of said silicon semiconductor substrate;
    D. conformally depositing a second layer of silicon nitride on exposed surfaces of said silicon dioxide filling said isolation trenches and on said silicon semiconductor substrate;
    E. anisotropically etching said second layer of silicon nitride such that silicon nitride remains at sidewalls of said silicon dioxide filling said isolation trenches and exposed beyond the top of said silicon semiconductor substrate, wherein silicon nitride has a different etch rate in an acidic solution from silicon dioxide filling said isolation trenches; and
    G. forming a field effect transistor in an active device area between said pair of isolation trenches in said silicon semiconductor substrate, wherein a drain silicide and a source silicide of said field effect transistor abuts said silicon nitride on said sidewalls of said silicon dioxide filling said isolation trenches.

* * * * *